(12) United States Patent
Lee et al.

(10) Patent No.: US 6,679,964 B2
(45) Date of Patent: Jan. 20, 2004

(54) METHOD FOR INTEGRATING IMAGE SENSORS WITH OPTICAL COMPONENTS

(75) Inventors: Chih-Kung Lee, Taipei (TW); Long-Sun Huang, Taipei (TW); Wen-Jong Chen, Taipei (TW); Ching-Heng Tang, Taipei (TW); Ching-Hua Lee, Tao Yuan (TW)

(73) Assignee: Slight Opto-Electronics Co., Ltd., Taipei (TW)

( * ) Notice: Subject to any disclaimer, the term of this patent is extended or adjusted under 35 U.S.C. 154(b) by 252 days.

(21) Appl. No.: 09/981,774

(22) Filed: Oct. 16, 2001

(65) Prior Publication Data

US 2003/0010425 A1 Jan. 16, 2003

(30) Foreign Application Priority Data

Jul. 14, 2001 (TW) ........................................ 89114210 A

(51) Int. Cl.[7] .............................................. H01L 21/46
(52) U.S. Cl. ..................... 156/182; 156/300; 156/308.2; 438/70; 438/458
(58) Field of Search ................................. 156/182, 250, 156/300, 308.2, 309.6; 257/432, 294; 438/48, 57, 69, 70, 458, 460; 358/509

(56) References Cited

U.S. PATENT DOCUMENTS 4,523,102 A * 6/1985 Kazufumi et al. ........ 250/208.1
6,429,036 B1 * 8/2002 Nixon et al. ................ 438/57
6,577,342 B1 * 6/2003 Wester ....................... 348/340
2002/0135825 A1 * 9/2002 Lee et al. .................... 358/509

* cited by examiner

Primary Examiner—Jeff H. Aftergut
Assistant Examiner—John T. Haran
(74) Attorney, Agent, or Firm—J.C. Patents

(57) ABSTRACT

The present invention is a wafer level integrating method for bonding an un-sliced wafer including image sensors and a wafer-sized substrate including optical components thereon. A zeroth order light reflective substrate is provided between the un-sliced wafer and the wafer-sized substrate. The image sensors are either CMOS or CCD image sensors. The wafer-sized substrate is a transparent plate and the optical components thereon include a blazed grating, a two-dimensional microlens array or other optical-functional elements. The wafer-sized substrate is bonded onto the zeroth order light reflective substrate by an appropriate optical adhesive to form a composite substrate. Bonding pads and bumps are provided at corresponding positions on the bonding surface of the un-sliced wafer and the composite substrate respectively so that the composite substrate and the un-sliced wafer can be bonded together through a reflow process. Alternatively, the composite substrate and the un-sliced wafer can be bonded together by cold compression or thermal compression. The resultant wafer is then sliced into separated image sensors for further packaging, such as CLCC, PLCC, QFP, QFN or QFJ. Alternatively, the resultant wafer can be packaged through a wafer-level chip scale packaging process.

19 Claims, 5 Drawing Sheets

METHOD FOR INTEGRATING IMAGE SENSORS WITH OPTICAL COMPONENTS

FIELD OF THE INVENTION

This invention relates generally to a method for integrating an image sensor with optical components, and more particularly to a wafer level integrating method for bonding un-sliced wafers having image sensors, wafer-sized substrates and optical components thereon.

BACKGROUND OF THE INVENTION

With the advent of the multimedia age and rapid development of the 3C (computer, communication and consumer) industries, there is an increasing demand for various electro-optical devices utilizing image sensors, such as digital cameras, digital video devices, and scanners. An image sensor is used to convert an optical image focused on the sensor into electronic signals. The image sensor typically includes an array of light detecting elements for producing a signal corresponding to the intensity of light impinging on the element so as to be used to display a corresponding image on a monitor or to provide information about the optical image.

The image sensors are generally classified into two categories, i.e. CCD (charge coupled device) image sensors and CMOS (complementary metal oxide semiconductor) image sensors. CCD image sensors have been developed over 30 years and much earlier than CMOS image sensors. Currently, most electro-optical devices use CCD image sensors, primarily due to their mature fabrication techniques and applications. However, CMOS image sensors have undergone rapid development in the recent years because they can integrate the peripheral controlling circuits so as to reduce the complexity and size of the electro-optical devices as well as the electric power consumption.

FIG. 1 is an exploded sectional view of a conventional image-sensing device 100. The image-sensing device 100 comprises a image sensor 110, a color filter 120 and a transparent plate 130. The image sensor 110 includes a two-dimensional array of light sensor cells, such as CCD or CMOS. The color filter 120, such as a trichroic filter, including R, G and B color filters (122, 124 and 126) is provided at the light-incident side of the image sensor 110. The transparent plate 130, for example, formed of glass is provided at the light-incident side of the color filter 120.

FIG. 2 is a schematic drawing of a prior art packaged image sensor. The bonding and packaging procedures of an image-sensing device are as follows. First, an image sensor 200 is bonded to a carrier 210, wire bonds 220 are electrically connected between the image sensor 200 and the carrier 210 and outside electrical leads 230 are connected to the terminals of the carrier 210. The image sensor 200 are precision optically aligned to the color filter 240 by using targets lithographically reproduced on both the image sensor 200 and the color filter 240. An optical coupling composition 250 is uniformly spread on the top of the image sensor 200. The color filter 240 is positioned over the image sensor 200 and disposed onto it so that the optical coupling composition 250 can be uniformly spread beneath the color filter 240. The color filter 240 and the image sensor 200 are optically aligned with each other by way of alignment targets, and then the image sensor 200/color filter 240 assembly is checked for debris or bubble entrapment. A conventional UV curable adhesive at each end of the color filter 240 is used for stacking the color filter 240 in place. Lastly, a transparent plate 260 is bonded onto the carrier 210 to protect the assembly from contaminants of foreign particles and moisture.

The conventional bonding and packaging procedures of the image sensor are based on a single die; that is, each die must be diced from a semiconductor wafer for further bonding and packaging processes. Since all bonding and packaging processes are based on chip scale, the precision requirement is very important and the procedure is very complicated. Moreover, the above-mentioned processes of bonding and packaging should be implemented in a very clean environment since foreign matter and moisture present within the space 270 will degrade the sensing quality. Therefore, manufacturing an image sensor through the conventional processes is subject to several disadvantages, for example, complex and heavy processes, low product yield, long manufacture cycling time and significant cost.

SUMMARY OF THE INVENTION

Accordingly, the present invention provides a wafer level integrating method for bonding un-sliced wafers having image sensors and a wafer-sized substrate including optical components thereon, comprising the steps of: bonding a wafer-sized substrate including the optical components thereon to a zeroth order light reflective substrate through an adhesive to form a composite substrate; and bonding the composite substrate to an un-sliced wafer including image sensors thereon to form a resultant wafer for further packaging processes.

Additional advantages, objects and features of the present invention will become more apparent from the description which follows.

BRIEF DESCRIPTION OF THE DRAWINGS

The present invention will become more apparent from the detailed description given herein below when read in conjunction with the accompanying drawings, in which.

DESCRIPTION OF THE PREFERRED EMBODIMENT

The present invention is explained with reference to a specific embodiment of a novel CMOS image-sensing device. However, this embodiment should be interpreted as illustrative and not limiting.

Figure 1:
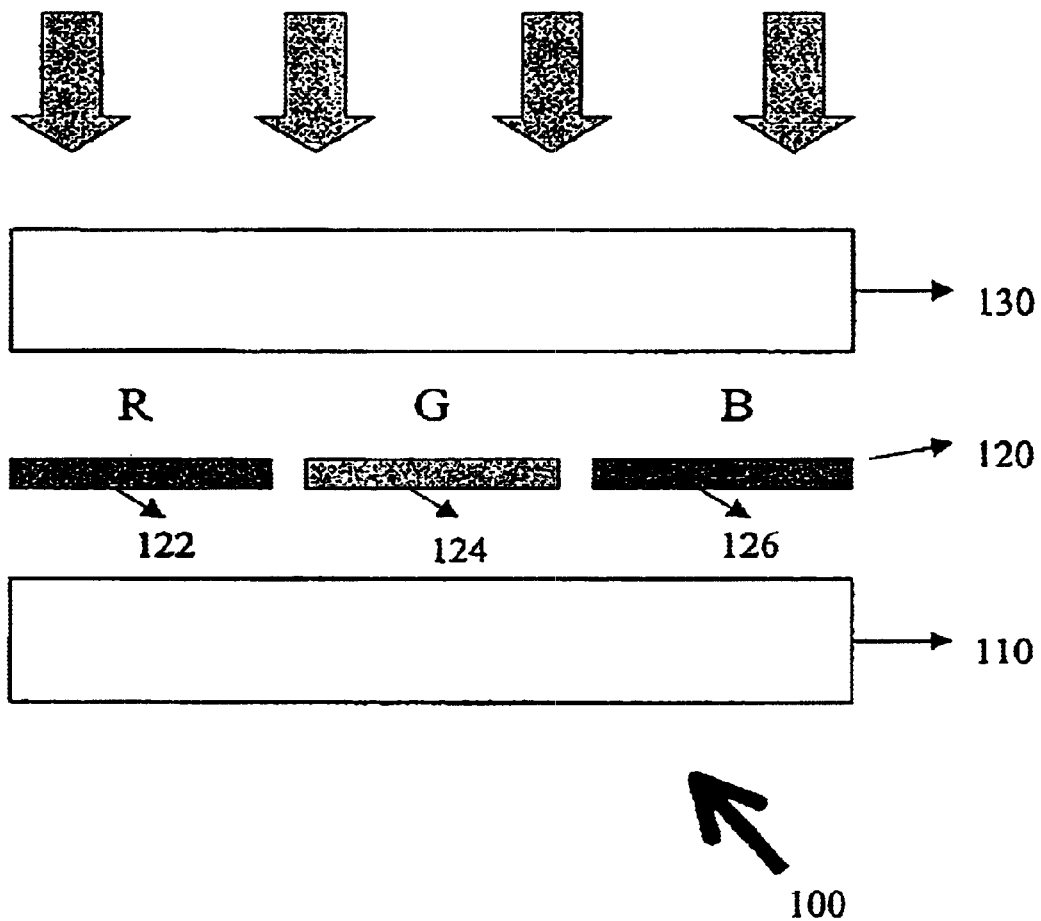
FIG. 1 is a exploded sectional view of a conventional image sensor.
Figure 2:
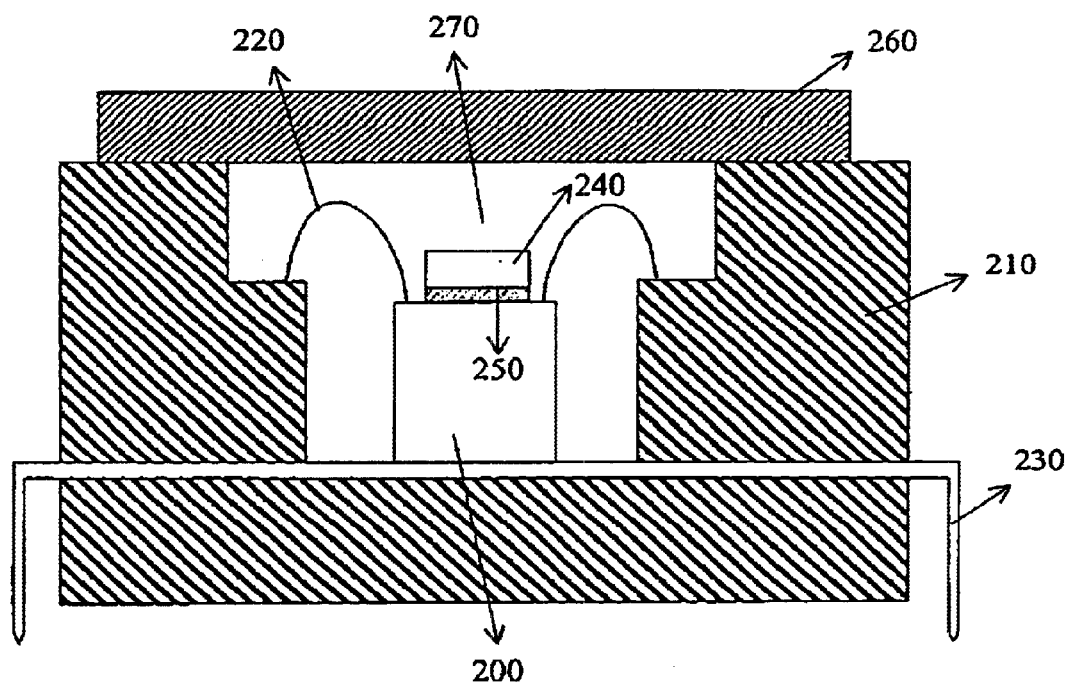
FIG. 2 is a schematic drawing showing a prior art packaged image sensor.

In the conventional image-sensing device 100 of FIG. 1, light beams emitted from the light source pass through the transparent plate 130 and further through the color filter 120 such that only R, G and B colors within the incident light beams are permitted to pass through for being sensed by the image sensor 110. Since the color filter 120 filters the colors other than R, G and B colors out, only about one third of the incident light will impinge on the image sensor 110 thereby causing a reduction in imaging quality.

Figure 3:
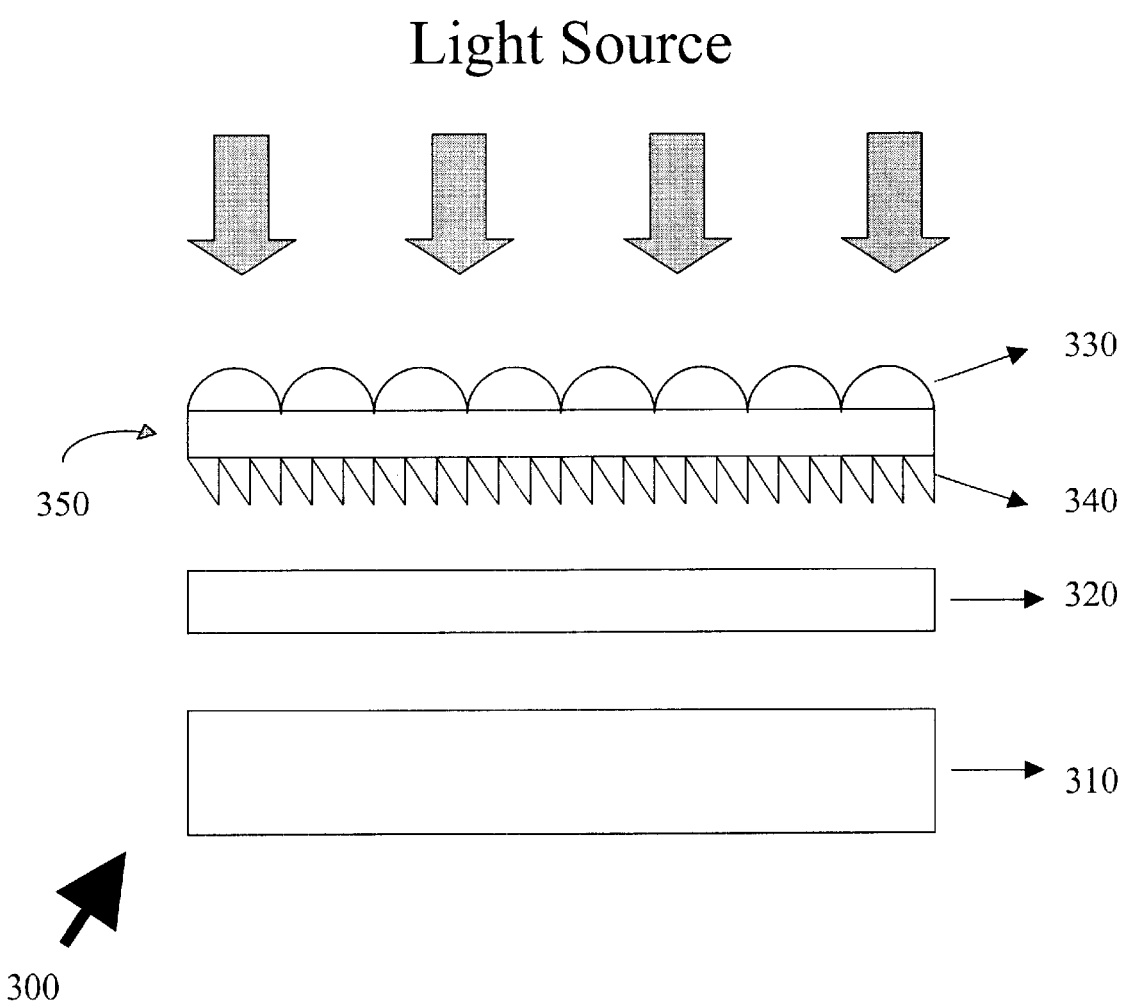
FIG. 3 is a sectional view of a novel CMOS image-sensing device.

FIG. 3 is a sectional view of a novel CMOS image-sensing device 300 comprising a CMOS image sensor array 310, a zeroth order light reflective substrate 320 and a light-converging color-separating substrate 350. The light-converging color-separating substrate 350 is provided with a two-dimensional microlens array 330 on the light-incident side thereof and a blazed grating 340 on the opposite side. It should be noted that the microlens array and the blazed grating could be provided on the same side of the light-converging color-separating substrate. The microlens of the two-dimensional microlens array 330 is used for converging the incident light beams and the blazed grating 340 is used for separating the incident light beams into alternatively arranged R-, G- and B-color light beams by diffraction effect so that the light intensity impinging on the image sensor array can be enhanced.

Figure 4:
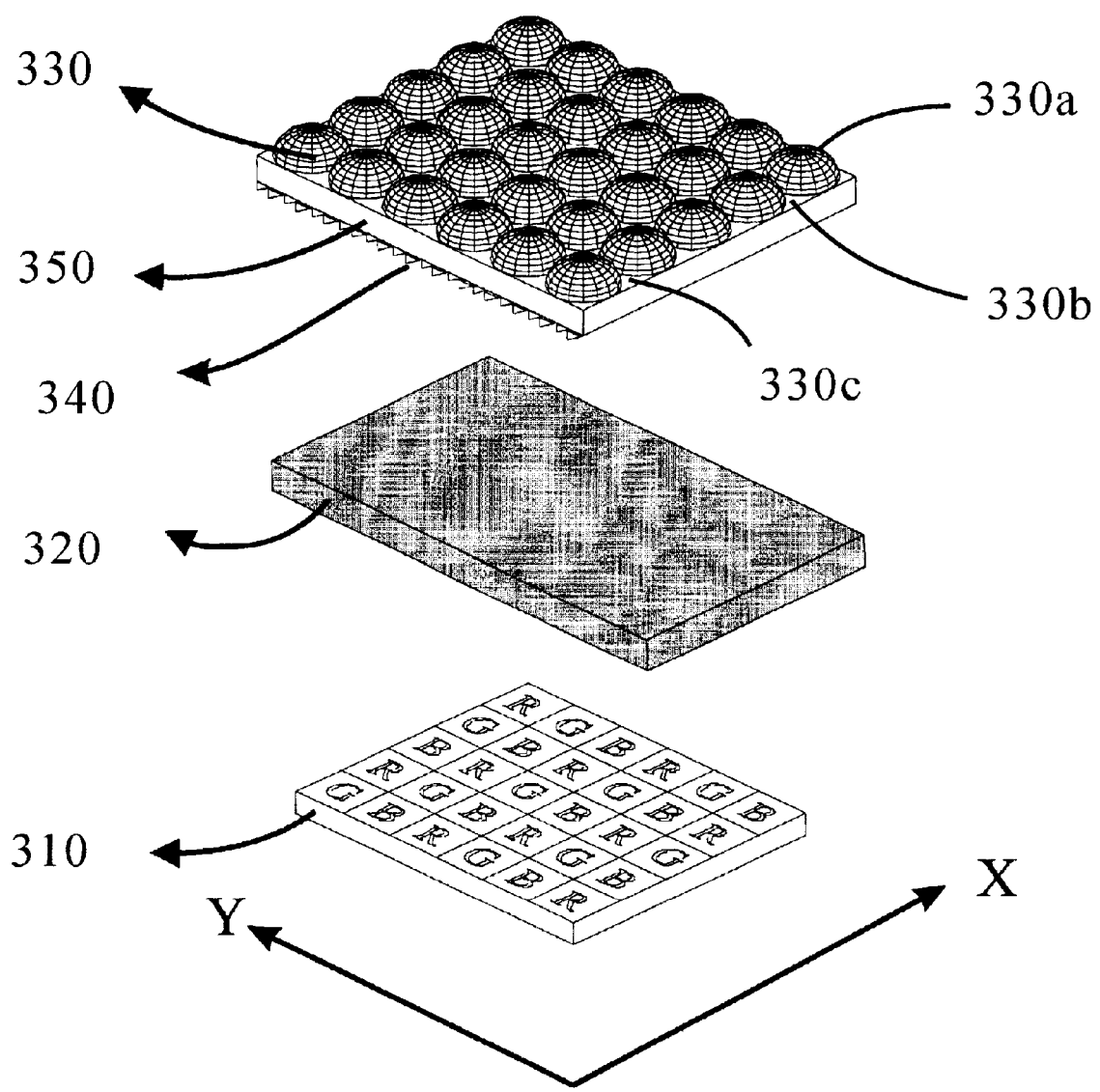
FIG. 4 is an exploded perspective view of the CMOS image-sensing device in FIG. 3.

FIG. 4 is an exploded perspective view of the CMOS image-sensing device 300 in FIG. 3 showing the arrangement of the microlens of the two-dimensional microlens array 330 and the light sensor cells of the image sensor array 310. In this embodiment, microlens 330a, 330b, 330c etc., have a spherical surface and are regularly arranged along the X- and Y-directions to form a two-dimensional array. The R, G and B-color light sensor cells of image sensor array 310 are alternatively arranged regularly along the X- and Y-directions thereon to form a two-dimensional array.

Figure 5:
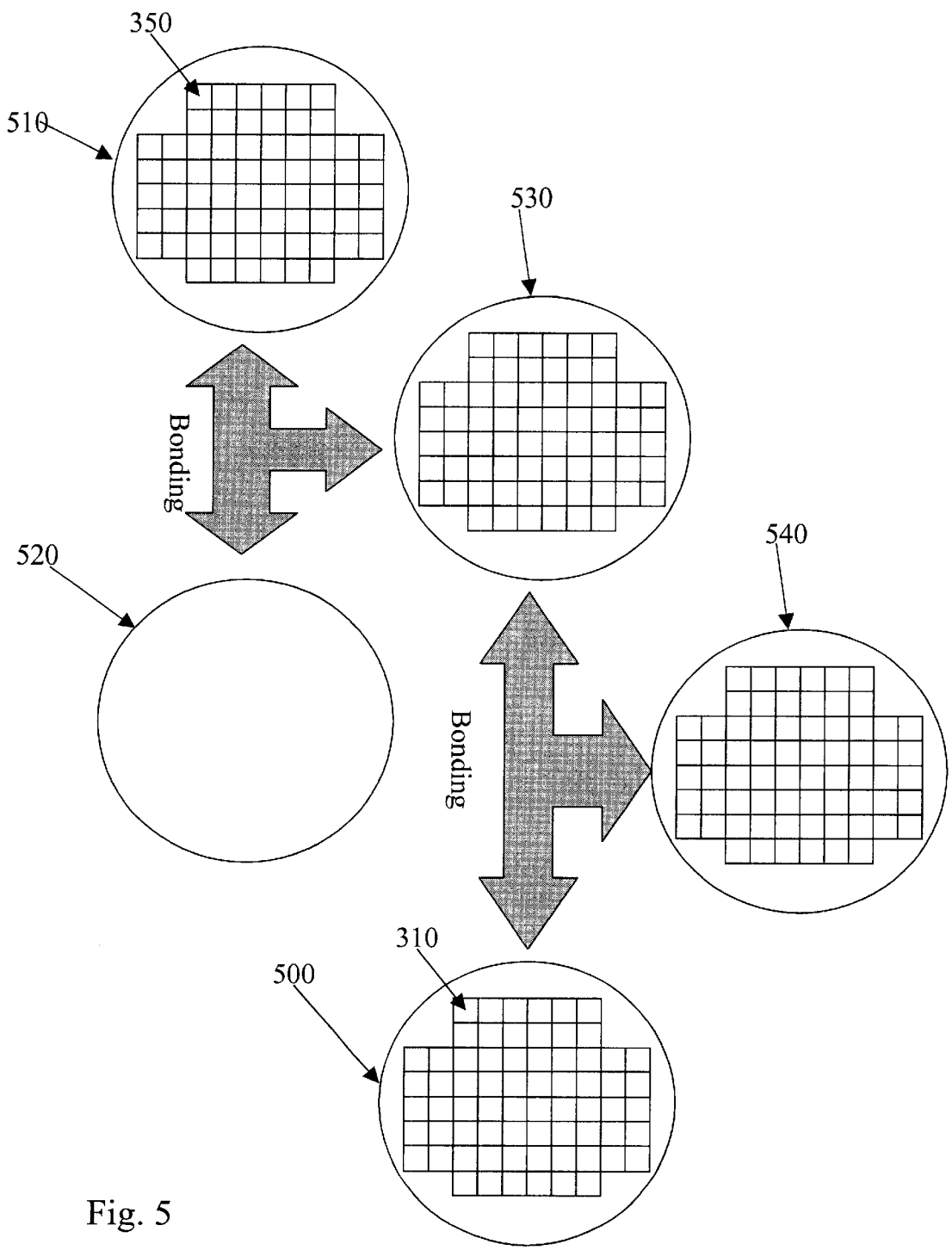
FIG. 5 illustrates the preferred integrating method for an image-sensing device according to the present invention.

The preferred integrating method of the image-sensing devices according to the present invention is illustrated in FIG. 5 which shows a method of wafer level bonding for an un-sliced wafer having image sensors and a wafer-sized substrate having optical components. Reference number 500 represents an un-sliced wafer, in which image sensors 310 are formed thereon by any conventional semiconductor manufacture procedures. Reference number 510 represents a wafer-sized substrate, in which light-converging color-separating components 350 are formed thereon by chemical etching technique of semiconductor manufacture procedures, conventional mechanical machining, laser machining and/or micro-electro-mechanical system technology (MEMS). A wafer-sized zeroth order light reflective substrate 520 provided between the un-sliced wafer 500 and the wafer-sized substrate 510 is bonded to the wafer-sized substrate 510 through a proper optical adhesive to form a composite substrate 530. Further, the composite substrate 530 is bonded to the un-sliced wafer 500 to form a resultant wafer 540. In the previous process, bonding pads and bumps are provided at the corresponding positions on the bonding surface of the un-sliced wafer and the composite substrate respectively so that the composite substrate 530 and the un-sliced wafer 500 can be bonded together through a reflow process, thermal compression or cold compression. After bonding, the bonding vias between the composite substrate and the un-sliced wafer are exposed by conventional means for further processing. Further, the resultant wafer can be sliced into separate image-sensing device for further packaging, such as CLCCA1, PLCCA2, QFPA3, QFNA4 or QFJA5. Alternatively, the resultant wafer can be packaged through a wafer-level chip scale packaging process.

Although the preferred embodiment of the present invention have been disclosed heretofore for illustrative purposes, those skilled in the art will appreciate that various modification, additions and substitutions are possible, without departing from the scope and spirit of the present invention as recited in the accompanying claims.

What is claimed is:

1. A method for integrating image sensors with a plurality of optical components, comprising the steps of:

(a) bonding a wafer-sized substrate including the optical components thereon to a zeroth order light reflective substrate through an adhesive to form a composite substrate; and (b) bonding the composite substrate to an un-sliced wafer including image sensors thereon to form a resultant wafer.

2. The method of claim 1, wherein in step (b), bonding pads and bumps are provided at the corresponding positions on the bonding surface of the un-sliced wafer and the composite substrate respectively.

3. The method of claim 2, wherein the bonding of the composite substrate and the un-sliced wafer is implemented through a reflow process.

4. The method of claim 2, wherein the bonding of the composite substrate and the un-sliced wafer is implemented by thermal compression.

5. The method of claim 2, wherein the bonding of the composite substrate and the un-sliced wafer is implemented by cold compression.

6. The method of claim 1, further comprising the step of slicing the resultant wafer into separated image sensors.

7. The method of claim 6, further comprising the step of exposing the bonding vias between the composite substrate and the un-sliced wafer for packaging.

8. The method of claim 7, wherein packaging the separated image sensors is completed through a CLCC packaging process.

9. The method of claim 7, wherein packaging the separated image sensors is completed through a PLCC packaging process.

10. The method of claim 7, wherein packaging the separated image sensors is completed through a QFP packaging process.

11. The method of claim 7, wherein packaging the separated image sensors is completed through a QFN packaging process.

12. The method of claim 7, wherein packaging the separated image sensors is completed through a QFJ packaging process.

13. The method of claim 1, further comprising the step of packaging the resultant wafer through the wafer level chip scale packaging process.

14. The method of claim 1, wherein the image sensors are CMOS image sensors.

15. The method of claim 1, wherein the image sensors are CCD image sensors.

16. The method of claim 1, wherein the wafer-sized substrate is a transparent plate.

17. The method of claim 1, wherein the optical components comprise a color separation filter.

18. The method of claim 1, wherein the optical components comprise a blazed grating.

19. The method of claim 18, wherein the optical components further comprise a two-dimensional microlens array.

* * * * *